United States Patent [19]

Fonash

[11] Patent Number: 5,750,981
[45] Date of Patent: May 12, 1998

[54] NON-CONTACT ELECTRO-OPTIC DETECTION OF PHOTOVOLTAGES CREATED IN A SEMICONDUCTOR BY A PROBE BEAM

[75] Inventor: Stephen J. Fonash, State College, Pa.

[73] Assignee: The Penn State Research Foundation, University Park, Pa.

[21] Appl. No.: 710,798

[22] Filed: Sep. 23, 1996

Related U.S. Application Data

[60] Provisional application No. 60/004,244, Sep. 25, 1995.
[51] Int. Cl.$^6$ ............................................. G01R 31/308
[52] U.S. Cl. ............... 250/214 R; 324/752; 324/753; 349/199
[58] Field of Search ................. 250/214, 214 R; 324/750, 752, 753, 754, 765, 770; 349/199

[56] References Cited

U.S. PATENT DOCUMENTS

| | | | |
|---|---|---|---|
| 4,703,260 | 10/1987 | Beha et al. | 324/752 |
| 5,030,909 | 7/1991 | Blancha et al. | 324/752 |
| 5,177,351 | 1/1993 | Lagowski . | |
| 5,311,137 | 5/1994 | Chang et al. | 349/199 |

OTHER PUBLICATIONS

Semicond. Sci. Technology, 7 (1992) A185–A192, pp. 10–17, "Non-contact Mapping of Heavy Metal Contamination for Silicon IC Fabrication", J. Lagowski et al.

*Primary Examiner*—Edward P. Westin
*Assistant Examiner*—Kevin Pyo
*Attorney, Agent, or Firm*—Thomas J. Monahan

[57] ABSTRACT

An electro-optic detector senses induced photovoltages in a semiconductor structure through use of an electro-optic sensing material. The sensing material is closely positioned to the surface of a semiconductor structure so as to be locally affected by electric field changes which occur as a result of induced photovoltages. An interrogating optical beam is directed at the semiconductor structure so as to induce locally positioned photovoltages at a surface thereof. An optical sensing beam is directed at the electro-optic sensing material and a detector senses reflections of the optical sensing beam from the electro-optic layer both in regions affected by the local photovoltage field changes and in regions not affected by the local photovoltage field changes. Characteristics of the semiconductor structure are deduced from reflection data derived from the optical sensing beam.

9 Claims, 2 Drawing Sheets

NON-CONTACT ELECTRO-OPTIC DETECTION OF PHOTOVOLTAGES CREATED IN A SEMICONDUCTOR BY A PROBE BEAM

The U.S. Government has rights in this invention as a result of funding under contract F33615-94-1-1464 administered by the U.S. Air force for the Defense Advance Research Projects Agency. Further, priority is hereby claimed from Provisional Application No. 60/004,244 filed Sep. 25, 1995 and entitled "Contactless Electro-Optic Detection of Photovoltages Created by a Second Probing Beam".

FIELD OF THE INVENTION

This invention relates to electro-optic detection of photovoltages induced in a semiconductor structure and, more particularly, to photovoltages created in the semiconductor structure by a second probe optical beam, thus avoiding need for contact to the semiconductor structure.

BACKGROUND OF THE ART

Methods of monitoring semiconductor material quality and the properties of structures fabricated in and on semiconductors are widely used. Such methods include the use of electron microscopy, probe testing, operational testers and other test modalities. Such test devices are preferably compatible with production lines and should use a contactless approach to monitoring so that the semiconductor structures are not damaged during the test procedure and can be returned to the production line after conclusion of the testing.

It is known that an optical probe beam will induce in a semiconductor, a photovoltage response. The photovoltage response results from a migration of charge to a surface of the semiconductor, with a resultant electric field state created thereby. The strength of the photovoltage response depends on the status of the semiconductor surface, the near surface, the bulk semiconductor, and can further depend upon the probe beam's intensity and wavelength. Such photovoltage responses have been utilized in prior art devices to enable assessment of semiconductor structures.

Referring first to FIG. 1, a prior art capacitive photovoltage probe is illustrated. Such capacitive probes comprise an arrangement of a cylinder 10, through which an optical beam 12 is directed. A lens 14 concentrates optical beam 12 through an aperture and lens 16 where it impinges on a surface 18 of a semiconductor wafer 20. Lens 16 includes a transparent conductive coating. A chuck 22 supports semiconductor wafer 20 and provides a back contact thereto. Optical beam 12 induces a photovoltage at surface 18, and the electric field resulting therefrom alters the capacitive coupling between surface 18 and lens 16. That change in electric field at lens 16 is sensed by an amplifier 24, whose output is fed to a processor (not shown) for analysis.

In order for the entire surface of semiconductor wafer 20 to be analyzed, the capacitive probe (or chuck 22) of FIG. 1 must be rastered to enable a mapping of the capacitive changes resulting from the surface features thereof. In such a capacitive probe approach to photovoltage sensing, the induced photovoltage is only measured at the position of the capacitive probe. Further, light beam 12 must always be chopped so as to enable capacitive detection.

Further details of the operation of the structure of FIG. 1 can be found in "NON-CONTACT MAPPING OF HEAVY METAL CONTAMINATION FOR SILICON IC FABRICATION", Lagowski et al., Semiconductor Science Technology, Vol. 7, 1992, pages A185–A192 and in U.S. Pat. No. 5,177,351.

The Photon Dynamics Corporation, 1504 McCarthy Blvd., Milpitas, Calif. markets a semiconductor test system which also senses electric field changes in semiconductor structures. In the Photon Dynamics structure, however, conductive patterns must be present on the semiconductor surface to allow voltages to be externally applied at varying points on the semiconductor surface (from controlled power sources). The Photon Dynamics system does not make use of photovoltages. A block diagram of the Photon Dynamics test system is shown in FIG. 2 and comprises a light source 30 which is directed to the surface of an electro-optic sensor 34. Bottom layer 35 of electro-optic sensor 34 is constructed to reflect the incident beam back to an imaging system such as a charge-coupled device (CCD) camera 37. The output from CCD camera 37 is fed to an image processor 36 which, in turn, is coupled to a display 38. Flux coupling from structures on the semiconductor surface modifies the film properties of electro-optic detector 34, allowing imaging of working and non-working structures.

The test system of FIG. 2 has been developed to image an active matrix liquid crystal display 40 which is driven by outputs from control signal module 42. When a particular liquid crystal site (e. g. 44) is activated, a localized electric field results which causes a local alteration of the electro-optic material within electro-optic sensor 34. That alteration is sensed by a change in the reflected beam which is sensed by CCD camera 37. Defective pixels can be determined by comparison of the reflection signals from CCD camera 37 with predetermined threshold values.

Thus, the Photon Dynamics test system applies voltages externally to rows and columns of liquid crystal array 40 and determines if resultant changes in optical reflectivity caused by electric fields from addressed pixel sites are as expected. The Photon Dynamics approach thereby requires active electrical contact to the semiconductor being tested.

Accordingly, it is an object of this invention to provide an electro-optic test system which is particularly adapted to use in a manufacturing environment.

It is another object of this invention to provide an improved electro-optic test system which avoids the need for the application of electrical stimulus signals to conductor patterns on a semiconductor device under test.

It is a further object of this invention to provide an improved electro-optic test system which avoids the need for electrical capacitive sensing and the required fine capacitive probe needed for lateral semiconductor surface resolution.

SUMMARY OF THE INVENTION

An electro-optic detector senses induced photovoltages in a semiconductor structure through use of an electro-optic sensing material. The sensing material is closely positioned to the surface of a semiconductor structure so as to be locally affected by electric field changes which occur as a result of induced photovoltages. An interrogating optical beam is directed at the semiconductor structure so as to induce locally positioned photovoltages at a surface thereof. An optical sensing beam is directed at the electro-optic sensing material and a detector senses reflections of the optical sensing beam from the electro-optic layer both in regions affected by the local photovoltage field changes and in regions not affected by the local photovoltage field changes. Characteristics of the semiconductor structure are deduced from reflection data derived from the optical sense beam.

DETAILED DESCRIPTION OF THE INVENTION

Figure 1:
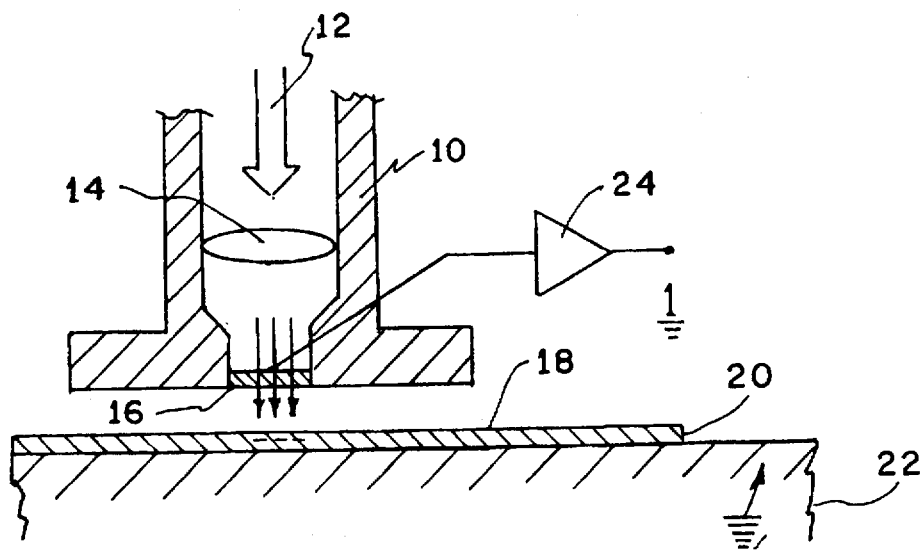
FIG. 1 is a schematic showing of a prior art photovoltage test system which makes use of capacitive coupling.
Figure 2:
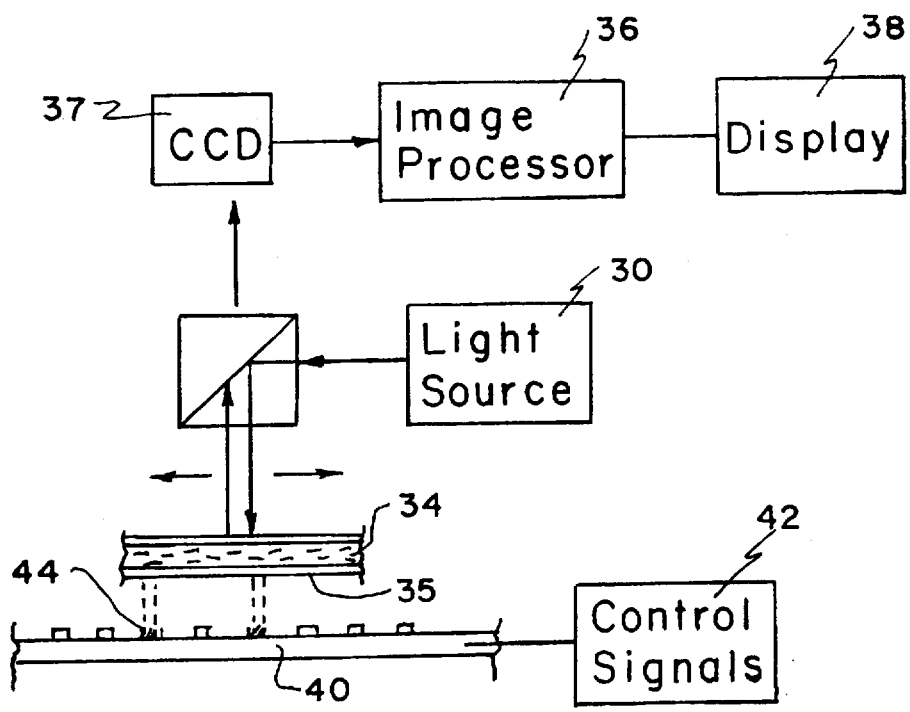
FIG. 2 is a schematic showing of a prior art electro-optic test system wherein an electro-optic layer is used to enable the sensing of electric field changes from an actively operated liquid crystal display matrix.
Figure 3:
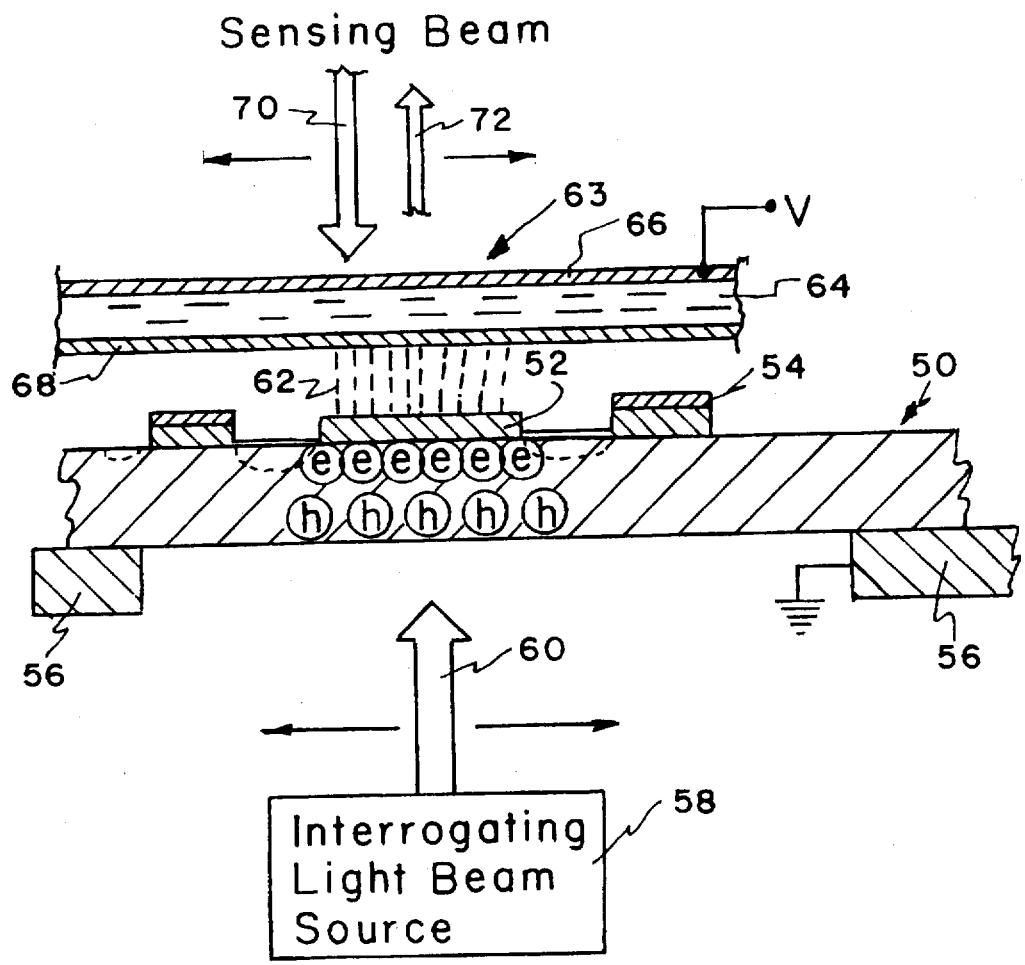
FIG. 3 is a schematic diagram illustrating the invention hereof.

Referring now to FIG. 3, the invention employs an electro-optic detector similar to that shown in FIG. 2; however, it does not require the application of active control signals from a control module (e.g. 42 in FIG. 2) to a semiconductor structure under test. In FIG. 3, semiconductor structure 50 is the unit under test and includes a number of surface features 52, 54, etc. which may or may not include conductive patterns. Semiconductor structure 50 resides on a platen 56 which is connected to a reference potential and enables the application of a reference potential thereto. An interrogating light source 58 outputs an interrogating light beam 60 which is scanned across semiconductor structure 50. At any point where light beam 60 is incident upon semiconductor structure 50, a counter-migration of electrons and holes occurs, thereby inducing a photovoltage which, in turn, creates electric field 62.

The characteristics and extent of electric field 62, for a given position of interrogating beam 60, are modified by surface features, 52, 54, etc., semiconductor properties and structure 50. By comparing features of the signals (e.g., strength of signal, lateral fall-off, etc.) derived from electric field 62 with the expected signal signature from a test standard, conclusions can be drawn regarding the adherence of semiconductor structure 50 to a predetermined acceptance criteria.

Positioned immediately over semiconductor structure 50 is a detector 63 for the mapping of the strength distribution and the lateral extent of electric field 62. Detector 63 is comprised of an electro-optic material 64 which is positioned between a pair layers 66 and 68. Layer 66 is transparent and further includes a transparent conductive layer on which a voltage V can be applied. Voltage V may be static or time-varying.

Electro-optic material 64 can comprise a liquid crystal material; a ferroelectric material or any other material which manifests an electric field impinging thereupon by a change in its optical property. Such materials may be, for instance, $LiTaO_3$, $LiNbO_3$, KDP (potassium dihydrogen phosphate), other materials whose crystal structure lacks inversion symmetry, poled polymers, etc. Poled polymers exhibit lower electro-optic coefficients, but have the advantage of being spin-coatable and being poled in place to align the molecules.

Layer 68 is preferably a dielectric mirror which enables the reflection of a sensing beam 70. Reflected sensing beam 72 is collected (for example by a prism (see FIG. 2)), is detected by CCD camera 37 and is thereafter processed by image processor 36.

The photovoltages induced by interrogating beam 60 in semiconductor structure 50 depend upon the quality of the bulk semiconductor; on the properties of the near surface region of the semiconductor; and on the properties of any layers deposited on the surface of the semiconductor. Hence, the photovoltage can vary laterally for a given position of the interrogating beam and therefore, electric field 62 varies with lateral position of the interrogating beam, if material and structural properties vary laterally across the semiconductor structure. This lateral variation can be detected by sensing beam 70, due to the resulting lateral changes in the electro-optic properties of film 64.

The photovoltage will also vary with wavelength, intensity and time variation of the probe beam. Interrogating beam 60 may be of varying intensity; varying wavelength and may be chopped or pulsed. It is preferred that interrogating beam 60 impinge on semiconductor structure 50 from the back as shown in FIG. 3.

By computer analysis, the properties of the various regions of semiconductor structure 50 and their lateral variation can be deduced, from the sensed photovoltage responses (or images can be compared to standards). The photovoltage at any lateral point on semiconductor structure is dictated by environment at and around the lateral point and the position of interrogating beam 60. The resultant electric field 62 causes a change in the optical properties of electro-optic material 64 directly above the semiconductor surface. This changes causes a modulation of sense beam 70, with the result that reflection beam 72 is altered, accordingly.

While not shown, various lens arrangements may be used to tightly focus sense beam 70 onto electro-optic layer 64 so as to be able to precisely image very small regions thereof which are affected by electric field 62. The scanning of interrogating beam 60 and sense beam 70 may be identical so that they are directly in line with each other or, by contrast, they may be offset so as to enable sense beam 70 to determine the peripheral effects of electric field 62, which result from an offset interrogating beam 60.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

I claim:

1. An electro-optic detector for detecting induced photovoltages in a semiconductor structure, said detector comprising:

interrogating beam means for directing an optical interrogating beam at said semiconductor structure so as to induce a photovoltage at a surface thereof;

electro-optic layer means juxtaposed to said surface so as to be locally affected by an electric field change which occurs as a result of an induced photovoltage in said semiconductor structure;

sensing beam means for directing a sensing beam at said electro-optic layer means; and detector means for detecting reflections of said sensing beam from said electro-optic layer means, both in regions thereof affected by a local field change and in regions not affected by a local field change, whereby characteristics of said semiconductor structure can be deduced from said reflections.

2. The electro-optic detector as recited in claim 1, wherein said optical interrogating beam is directed at one surface of said semiconductor structure and said sensing beam is directed at an opposed surface of said semiconductor structure.

3. The electro-optic detector as recited in claim 1, wherein said electro-optic means comprises an electro-optic material which responds to an electric field from an induced photovoltage by inducing an alteration in reflections of said sensing beam.

4. The electro-optic detector as recited in claim 3, wherein said electro-optic means comprises a liquid crystal material sandwiched between a transparent conductive layer and a reflective layer.

5. The electro-optic detector as recited in claim 4, further comprising:

means for applying an orienting voltage to said transparent conductive layer; and means for applying a reference signal to said semiconductor structure so as to enable said orienting voltage to orient said liquid crystal material.

6. The electro-optic detector as recited in claim 5, wherein said reference signal is either static or time varying.

7. The electro-optic detector as recited in claim 3, wherein said electro-optic means comprises a ferroelectric material sandwiched between a transparent conductive layer and a reflective layer.

8. The electro-optic detector as recited in claim 7, further comprising:

means for applying an orienting voltage to said transparent conductive layer; and means for applying a reference signal to said semiconductor structure so as to enable said orienting voltage to orient said ferroelectric material.

9. The electro-optic detector as recited in claim 8, wherein said reference signal is either static or time varying.

* * * * *